United States Patent
Kikkawa et al.

(10) Patent No.: US 8,030,164 B2
(45) Date of Patent: Oct. 4, 2011

(54) COMPOUND SEMICONDUCTOR STRUCTURE

(75) Inventors: Toshihide Kikkawa, Kawasaki (JP); Kenji Imanishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/248,357

(22) Filed: Oct. 9, 2008

(65) Prior Publication Data

US 2009/0065787 A1 Mar. 12, 2009

Related U.S. Application Data

(63) Continuation of application No. PCT/JP2006/307566, filed on Apr. 10, 2006.

(51) Int. Cl.
*H01L 29/205* (2006.01)
*H01L 21/336* (2006.01)
*H01L 29/778* (2006.01)

(52) U.S. Cl. ... 438/285; 257/76; 257/194; 257/E29.246; 257/E21.403

(58) Field of Classification Search ............ 438/285, 438/12–15; 356/402–425
See application file for complete search history.

(56) References Cited

U.S. PATENT DOCUMENTS

| | | | |
|---|---|---|---|
| 6,610,551 B1 | 8/2003 | Doverspike et al. | |
| 2002/0110945 A1 | 8/2002 | Kuramata et al. | |
| 2004/0144991 A1 | 7/2004 | Kikkawa et al. | |
| 2005/0274980 A1* | 12/2005 | Miyoshi | 257/192 |
| 2007/0164321 A1* | 7/2007 | Sheppard et al. | 257/256 |

FOREIGN PATENT DOCUMENTS

| | | |
|---|---|---|
| JP | 2000-040858 A | 2/2000 |
| JP | 2002-527890 A | 8/2002 |
| JP | 2002-359256 A | 12/2002 |
| JP | 2004-221325 A | 8/2004 |
| WO | 00/21144 A2 | 4/2000 |

OTHER PUBLICATIONS

Gary Lyn Harris, Properties of Silicon Carbide, 1995, IET, pp. 19, 170-180.*
Gary L Harris, Properties of Silicon Carbide, 1995,INSPEC, vol. 13, pp. 19 and 170-180, isbn:0852968701.*
M. Kanamura et al. "A 100-W High-Gain AlGaN/GaN HEMT Power Amplifier on a Conductive N-SiC Substrate for Wireless Base Station Applications," Electron Devices Meeting; 2004; IEDM Technical Digest; IEEE International Dec. 13-15, 2004; pp. 799-802.
"[Press Release] Fujitsu Develops Breakthrough Technology for Low-Cost Production of Gallium-Nitride HEMT;" [online]; Dec. 21, 2004; Fujitsu Laboratories Ltd., retrieval date Jun. 26, 2006.
International Search Report of PCT/JP2006/307566, date of mailing Jul. 4, 2006.

\* cited by examiner

*Primary Examiner* — Zandra Smith
*Assistant Examiner* — Lawrence Tynes, Jr.
(74) *Attorney, Agent, or Firm* — Westerman, Hattori, Daniels & Adrian, LLP (57) ABSTRACT

A method for manufacturing a compound semiconductor structure, includes (a) selecting a conductive SiC substrate in accordance with color and resistivity and (b) epitaxially growing a GaN series compound semiconductor layer on the selected conductive SiC substrate. The step (a) preferably selects a conductive SiC substrate whose main color is green, whose conductivity type is n-type and whose resistivity is 0.08 $\Omega$cm to $1\times10^5$ $\Omega$cm, or whose main color is black, whose conductivity type is p-type and whose resistivity is $1\times10^3$ $\Omega$cm to $1\times10^5$ $\Omega$cm, or whose main color is blue, whose conductivity type is p-type and whose resistivity is 10 $\Omega$cm to $1\times10^5$ $\Omega$cm. The step (b) preferably includes (b-1) growing an AlInGaN layer having a thickness not thinner than 10 μm on the conductive SiC substrate by hydride VPE.

18 Claims, 7 Drawing Sheets

| COLOR (CONDUCTIVITY TYPE) | RESISTIVITY (Ω cm) | ABSORPTION PEAK (μm) |
|---|---|---|
| GREEN (n) | 0.08-1E5 | 0.6 |
| BLUE (p) | 10-1E5 | 0.5 |
| BLACK (p) | 1E3-1E5 | 0.75 |

| GREEN SAMPLE | RESISTIVITY (Ω cm) |
|---|---|
| S1 | 0.12 |
| S2 | 0.08 |
| S3 | 0.04 - 0.05 |
| S4 | 0.01 - 0.02 |

COMPOUND SEMICONDUCTOR STRUCTURE

CROSS REFERENCE TO RELATED APPLICATION

This application claims priority of PCT/JP2006/307566, filed on Apr. 10, 2006, the entire contents of which are incorporated herein by reference.

BACKGROUND

1. Field

The present invention relates to a compound semiconductor structure and its manufacture method, and more particularly to a GaN series compound semiconductor structure using a conductive SiC substrate and its manufacture method. Here, GaN series compound semiconductor is represented by $Al_x In_y Ga_{1-x-y} N$ ($0 \leq x \leq 1.0$, $0 \leq y \leq 1.0$).

2. Description of the Related Art

Compound semiconductor devices using GaN or GaN series compound semiconductor are under vigorous development. GaN has a wide band gap of 3.4 eV and can operate at high voltages. Various semiconductor devices can be manufactured by forming a hetero junction using GaN series compound semiconductor. Metal organic chemical vapor deposition (MOCVD) is mainly used as a crystal growth method.

GaN has a high breakdown voltage, and is expected to be applied to usage requiring high voltage and high speed operation such as a high electron mobility transistor (HEMT) used at a base station of mobile phones. A variety of GaN-HEMTs have been reported which use as an electron transport layer a GaN layer of GaN/AlGaN crystals grown on a substrate such as sapphire, SiC, GaN and Si.

JP-A-2002-352956 proposes a GaN series HEMT having a high on-breakdown voltage and improved I-V characteristics, which is manufactured for example by laminating on a c-plane sapphire substrate an i-type GaN electron transport layer, an i-type AlGaN spacer layer, an Si-doped n-type AlGaN electron supply layer and an Si-doped n-type GaN protective layer by MOCVD, depositing an SiN layer by CVD, forming openings through the SiN layer, and forming source/drain ohmic electrodes and a gate Schottky electrode.

JP-A-2004-221325 proposes a HEMT which is manufactured by laminating on an SiC substrate an i-type GaN electron transport layer, an i-type AlGaN spacer layer, an Si-doped n-type AlGaN electron supply layer and an Si-doped n-type GaN cap layer, forming source/drain ohmic electrodes, thereafter depositing a first SiN protective film by CVD, forming an opening through the first SiN protective film, and forming a gate Schottky electrode, and further forming a second SiN protective film. This structure can suppress current collapse, i.e., a change in an on-resistance during operation.

A breakdown voltage in current-off state in excess of 300 V is presently reported. Best output characteristics are obtained by a GaN-HEMT using an SiC substrate. A high thermal conductivity of SiC contributes to this performance. When a high speed operation GaN device is to be manufactured, a semi-insulating SiC substrate is used in order to restrict parasitic capacitance.

SUMMARY

According to one aspect of the present invention, there is provided a compound semiconductor structure comprising:

a conductive SiC substrate whose main color is green, whose conductivity type is n-type and whose resistivity is 0.08 Ωcm to 1×10⁵ Ωcm, or whose main color is black, whose conductivity type is p-type and whose resistivity is 1×10³ Ωcm to 1×10⁵ Ωcm, or whose main color is blue, whose conductivity type is p-type and whose resistivity is 10 Ωcm to 1×10⁵ Ωcm; and an AlInGaN layer having a thickness not thinner than 10 μm and formed on the conductive SiC substrate.

According to another aspect of the present invention, there is provided a method for manufacturing a compound semiconductor structure, comprising:

(a) selecting a conductive SiC substrate in accordance with color and resistivity; and (b) epitaxially growing a GaN series compound semiconductor layer on the selected conductive SiC substrate.

DESCRIPTION OF THE PREFERRED EMBODIMENTS

A semi-insulating SiC substrate is very expensive, presenting a possibility that this high cost may hinder prevail of GaN-HEMTs. A conductive SiC substrate is available less expensively than a semi-insulating SiC substrate. If GaN series compound semiconductor devices having good characteristics can be manufactured using conductive SiC substrates, this contributes to prevail of GaN-HEMTs.

If a conductive SiC substrate is used, a GaN series compound semiconductor device having a high thermal conductivity of SiC can be manufactured less expensively. However, using a conductive substrate increases parasitic capacitance of a semiconductor device and hinders high speed operation. Parasitic capacitance can be reduced by intervening a thick semi-insulating or high resistivity compound semiconductor layer between a conductive substrate and constituent elements of a semiconductor device.

Figure 1A:
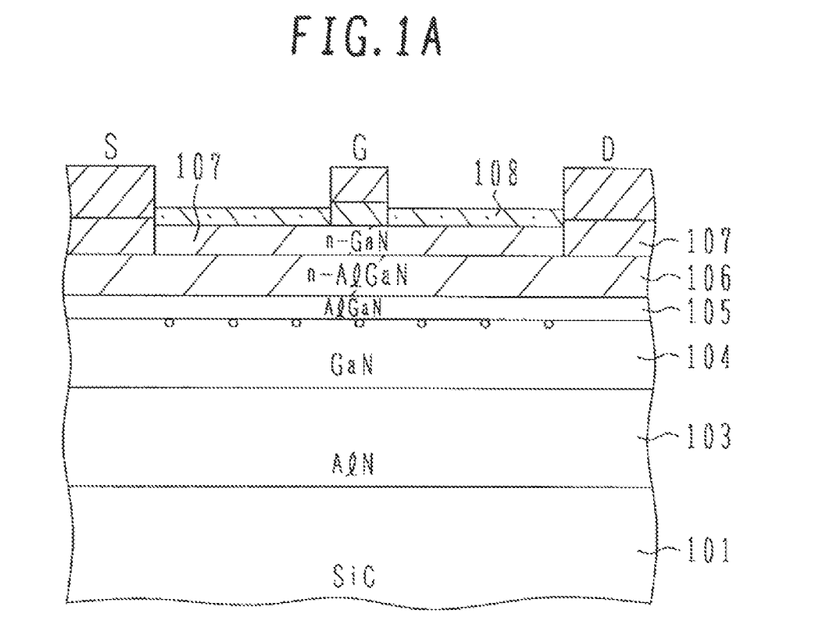
FIG. 1A is a cross sectional view showing the structure of a GaN-HEMT using a conductive SiC substrate according to an embodiment.

FIG. 1A is a schematic cross sectional view showing the structure of a GaN-HEMT device. A semi-insulating or high resistivity AlN buffer layer 103 is grown thick on a (0001) single crystal conductive SiC substrate 101. It is known that metal organic chemical vapor deposition (MOCVD) and hydride vapor phase epitaxy (VPE) are typically used as a crystal growth method of growing GaN series compound semiconductor.

Figure 2A:
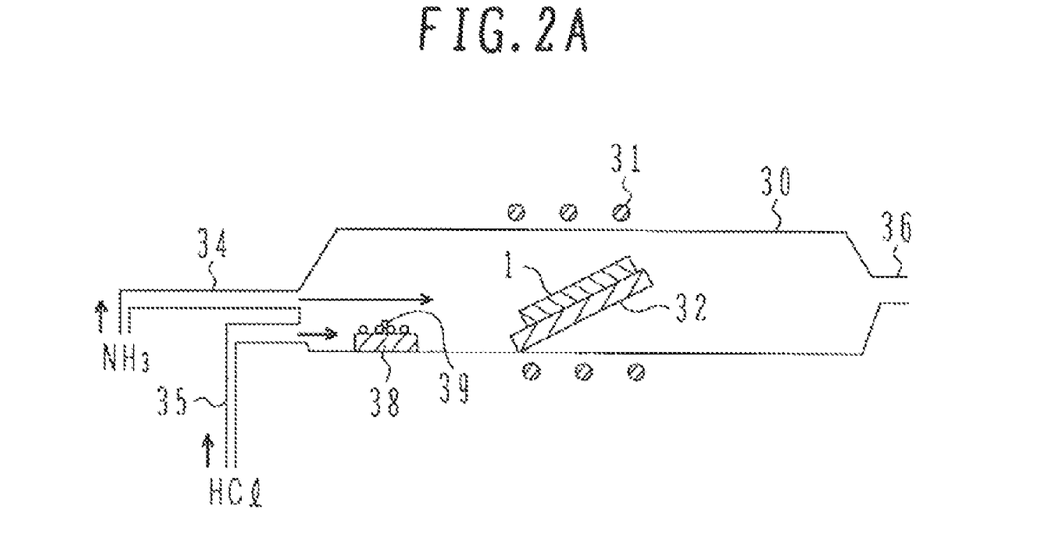
FIGS. 2A and 2B are schematic cross sectional views of a hydride VPE system and an MOCVD system, respectively.
Figure 2B:
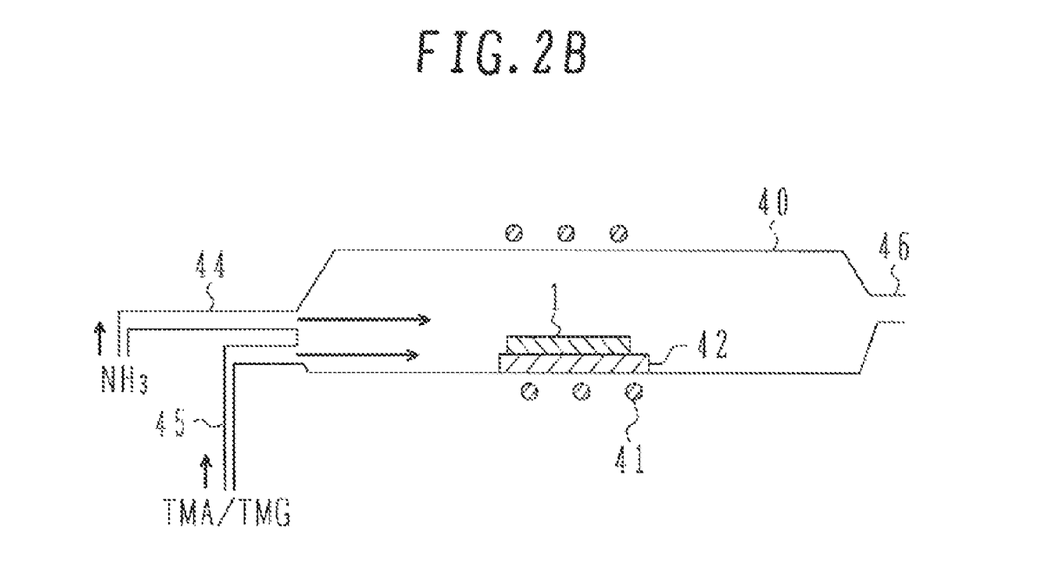

FIGS. 2A and 2B schematically show the structures of a hydride VPE system and an MOCVD system.

FIG. 2A is a schematic cross sectional view showing the structure of a hydride VPE system. A high frequency coil 31 for induction heating is wound around a quartz reaction tube 30, and a carbon susceptor 32 for placing thereon a substrate 1 is disposed in the quartz reaction tube. Two gas introducing pipes 34 and 35 are connected to the upstream end of the reaction tube 30 shown left in FIG. 2A, and a gas exhaust pipe 36 is connected to the downstream end of the reaction tube 30. A boat 38 is disposed in the reaction tube 30 at an upstream position of the susceptor 32, and a source 39 of a group III element for a compound to be grown is accommodated in the boat. For example, the source is Al if AlN is to be grown, and Ga if GaN is to be grown. Ammonia $NH_3$ as N source gas is introduced via the gas introducing pipe 34, and HCl is introduced via the gas introducing pipe 35. HCl reacts with the group III element source 39 in the boat 38 to form group III element chloride AlCl. Source gases AlCl and $NH_3$ are transported to the substrate and allow reaction on the substrate surface to grow AlN. Surplus gas is exhausted via the gas exhaust pipe 36 to a detoxification tower.

FIG. 2B is a schematic cross sectional view showing the structure of an MOCVD system. A high frequency coil 41 is disposed outside a quartz reaction tube 40, and a carbon susceptor 42 for placing thereon a substrate 1 is disposed in the reaction tube 40. Two gas introducing pipes 44 and 45 are connected to the reaction tube 40 on the upstream side to supply source gases for compound. For example, $NH_3$ as N source gas is introduced via the gas introducing pipe 44, and organic group III element compound source material such as trimethylaluminum or trimethylgallium as group III element source gas is introduced via the gas introducing pipe 45. Crystal growth progresses on the substrate 1, and surplus gas is exhausted via the gas exhaust pipe 46 to a detoxification tower. If MOCVD is to be performed in a low pressure atmosphere, the gas exhaust pipe 46 is connected to a vacuum pump, and an exhaust port of the vacuum pump is coupled to a detoxification tower.

MOCVD is a method having been used widely as a compound semiconductor crystal growth method, and can obtain good crystallinity. Various techniques for impurity doping and thickness control have been established. However, a growth speed is 1 μm/hour (H) at the most.

Hydride VPE uses chloride as a group III element source. A growth speed is extremely high to the extent that a growth speed of several tens μm/hour is possible. A grown crystal layer has a high possibility of containing chlorine (Cl) dependent upon the source gas. For growing a compound semiconductor layer with a thickness of the order of 10 μm or more, a growth speed of MOCVD is too slow, and hydride VPE capable of estblishing a high growth speed is suitable.

For forming a GaN-HEMT on a conductive SiC substrate, it is desirable to first grow a semi-insulating or high resistivity AlN layer 103 with a thickness of 10 μm or more, e.g., a thickness of 20 μm to 50 μm, on a conductive SiC substrate by hydride VPE. As a thick AlN layer is grown by hydride VPE, dislocation is reduced and crystallinity can be improved. Thereafter, a HEMT constituting lamination is grown by MOCVD.

As shown in FIG. 1A, an AlN layer 103 is grown to a thickness of about 25 μm on a (0001) plane single crystal conductive SiC substrate 101 by hydride VPE. A hydride VPE system has a structure as shown in FIG. 2A, and a group III element source material in the boat 38 is Al. The conditions of hydride VPE are:

Pressure: normal pressure,
Gas flow rate: HCl 100 ccm (cubic centimeter per minute),
$NH_3$ 10 LM (litter per minute),
Temperature: 1100° C.

A resistivity of an AlN layer can be set extremely high, e.g., higher than 1E5 ($1 \times 10^5$) Ωcm.

A HEMT structure lamination is grown on the AlN buffer layer 103 by MOCVD.

An MOCVD system having the structure shown in FIG. 2B is used, and the conditions of MOCVD are, for example, as follows:

Source materials and flow rates:

| | |
|---|---|
| Trimethylgallium (TMG) | 50 sccm (standard ccm), |
| Trimethylaluminum (TMA) | (if necessary) 5 sccm, |
| Ammonia ($NH_3$) | 20 SLM (standard LM), |
| N-type impurity: | silane ($SiH_4$), |
| P-type impurity: | biscyclopenta-dienyl-magnesium (Cp2Mg), |
| Pressure: | 100 torr, |
| Temperature: | 1100° C. |

By supplying TMG and $NH_3$ (and not supplying TMA), a GaN layer 104 having a thickness of, e.g., 3 μm, is grown on the AlN buffer layer 103. This GaN layer 104 is a non-doped layer, and forms a region of an active layer in which two-dimensional electron gas transports.

After the GaN layer 104 is grown, supply of TMA as Al source gas starts to grow a non-doped AlGaN layer 105 having a thickness of, e.g., 5 nm, and in succession, silane ($SiH_4$) as source gas of n-type impurity is introduced to grow an n-type AlGaN layer 106 of 20 nm thick. A doping amount of Si impurity in the n-type AlGaN layer 106 is, for example, about $4 \times 10^{18}$ cm$^{-3}$. The non-doped AlGaN layer 105 serves as a spacer layer and isolates the n-type AlGaN layer 106 from the active layer 104. The n-type AlGaN layer 106 serves as an electron supply layer to supply electron carriers to the active layer 104. In this manner, the basic structure of HEMT is formed.

Further, stopping supply of TMA, an n-type GaN layer 107 as a protective layer is grown on the n-type AlGaN layer 106. A doping amount of Si is, for example, about $5 \times 10^{18}$ cm$^{-3}$. The n-type AlGaN layer 106 is therefore covered with the n-type GaN layer 107 having a lower resistivity.

The substrate is taken out from the MOCVD system, an isolation region is formed by recess etching using $BCl_3$, and thereafter an SiN film 108 is deposited by plasma CVD. Openings for source/drain contact regions are formed through the SiN film, and the n-type GaN layer is etched and removed by dry etching using $Cl_2$. For example, a Ta layer of 10 nm thick is formed, an Al layer of 300 nm thick is formed on the Ta layer, and they are patterned to form a source electrode S and a drain electrode D. These electrodes can be patterned, for example, by lift-off method. Annealing is performed at 600° C. to form ohmic contacts. The SiN film 108 in a gate contact region is etched, and for example, an Ni layer of 20 nm thick and an Au layer of 400 nm thick are formed and patterned to form a gate electrode. This electrode can be formed, for example, also by lift-off method. The gate electrode forms a Schottky contact.

By growing the semi-insulating AlN layer 103 thick, at least to a thickness of 10 μm, it can be expected that parasitic capacitance of HEMT can be suppressed. The AlN layer also has the effects of reducing dislocation and improving crystallinity with the growth of the AlN layer. In the context of this point, it is particularly preferable to grow the AlN layer not thinner than 20 μm. Although an upper limit of thickness is determined by a warp and crack of a wafer, an upper limit of, e.g., 50 μm, may be selected. A current collapse phenomenon of a change in an on-resistance during operation can be avoided by forming the GaN protective layer and SiN layer on and above the n-type AlGaN electron supply layer.

SiC has a high thermal conductivity and is expected to realize high breakdown voltage and high speed operation. However, GaN-HEMT devices formed actually by growing a GaN series compound semiconductor crystal layers on a conductive SiC substrate had no reproductivity.

Figure 3:
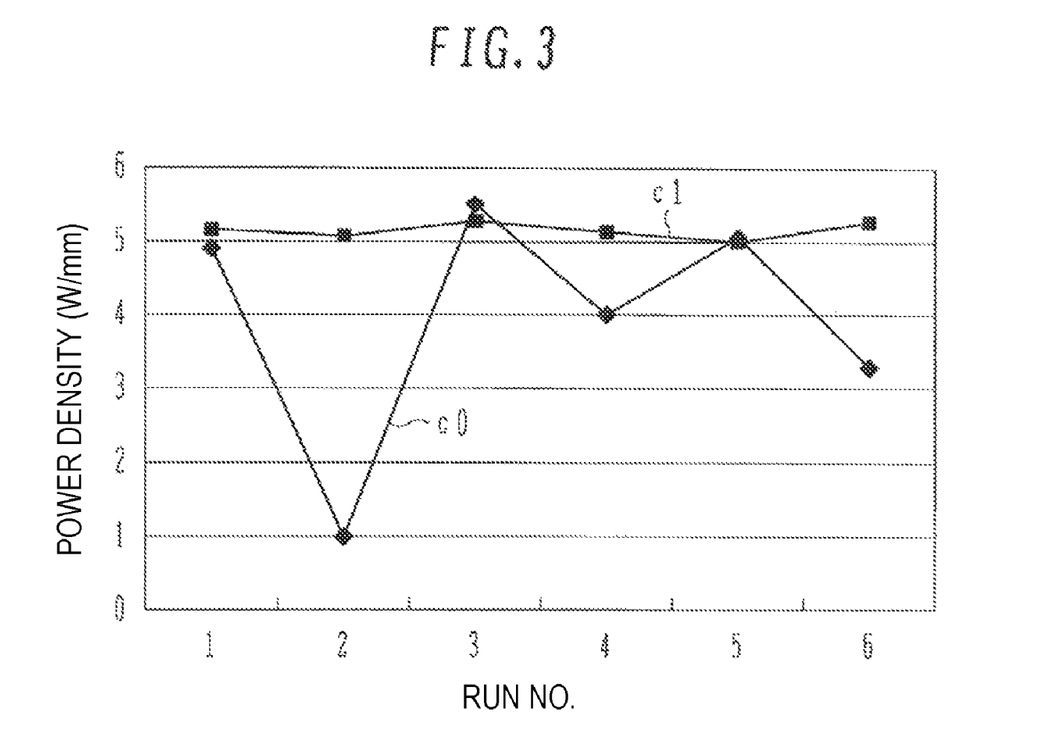
FIG. 3 is a graph showing a power density at each run when conductive SiC substrates selected without a selection criterion are used and when conductive SiC substrates selected in accordance with a selection criterion are used.

FIG. 3 shows measurement results of a power density per unit gate width at each experimental run. A curve c0 shows experiment results. There was a large variation and the devices cannot be brought into practical use. The present inventors have studied the reason why expected performance was not able to be realized.

A semi-insulating SiC substrate is transparent, whereas a conductive SiC substrate presents various coloring. This coloring is caused by various impurities contained in the substrate. A black substrate attributable to B shows p-type conductivity, a green substrate attributable to N shows n-type conductivity, and a blue substrate attributable to Al shows p-type conductivity. Color of a conductive SiC substrate is governed by concentrations of impurities and energy levels, and the color becomes stronger as the resistivity is lower.

Figure 4A:
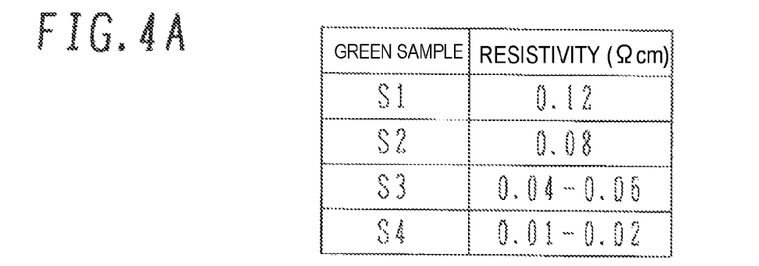
FIGS. 4A, 4B and 4C show a table showing resistivities of green conductive SiC substrates, a graph showing absorption coefficients dependent upon resistivities, and a graph showing a relation between a resistivity and a surface temperature during crystal growth, respectively.
Figure 4B:
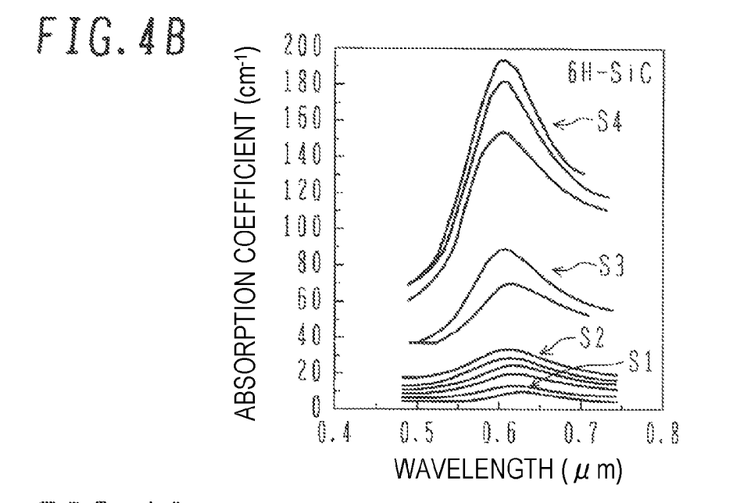

FIGS. 4A and 4B show some examples of a green substrate. FIG. 4A is a table showing examples of resistivity. Samples S1 have a resistivity around 0.12 ohm-cm, samples S2 has a resistivity around 0.08 ohm-cm, samples S3 have a resistivity around 0.04-0.06 ohm-cm, and samples S4 have a resistivity aound 0.01-0.02 ohm-cm. FIG. 4B is a graph showing optical absorption spectra of examples S1-S4 of the green substrate. The abscissa represents a wavelength in the unit of μm, and the ordinate represents an absorption coefficient in the unit of cm$^{-1}$. Spectra identified with symbols S1-S4 correspond to samples S1-S4 shown in FIG. 4A. An absorption band having a peak near a wavelength of 0.6 μm is observed. It can be understood that the lower a resistivity, the higher a peak absorption coefficient is. In spectra S4 and S3, the peak absorption coefficient is more than twice the absorption coefficient at 0.5 μm. In spectra S2 and S1, the peak absorption coefficient is at most around 30 cm$^{-1}$, and is less than twice the absorption coefficient at 0.5 μm.

A GaN series compound semiconductor layer is usually grown at a temperature of 1000° C. or higher, e.g., in an incandescent state at 1100° C. Heat source is radiation heat from the carbon susceptor 32, or 42 shown in FIG. 2A, or 2B. It can be considered that if a conductive SiC substrate shows absorption near at a wavelength of, e.g., 0.6 μm, at least a portion of radiation heat from the carbon susceptor will be absorbed in the SiC substrate. In this case, it can therefore be considered that a temperature of the uppermost surface of the substrate during crystal growth may be lowered.

Figure 4C:
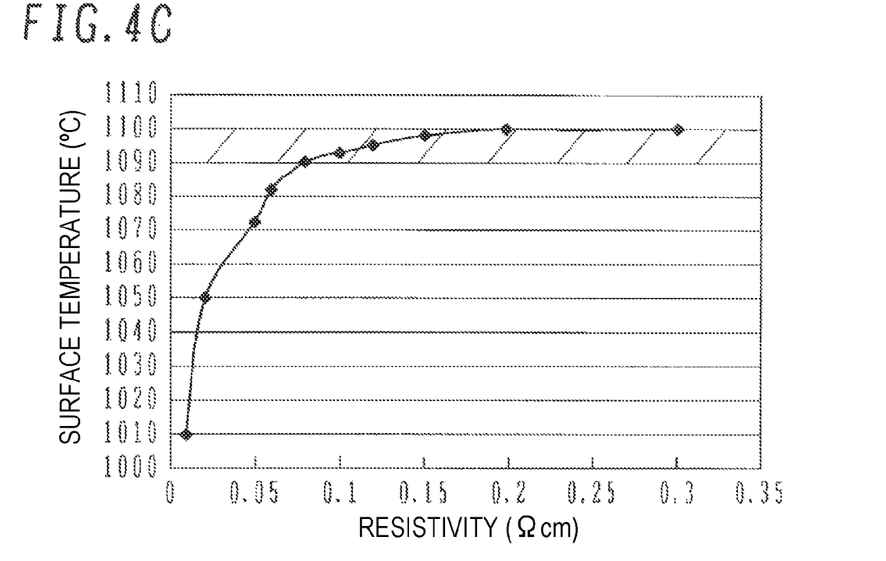

FIG. 4C is a graph showing measurement results of an actual temperature of a crystal growth surface at each resistivity of the green SiC substrate, under the setting of crystal growth at a surface temperature of 1100° C. An abscissa represents a resistivity of the SiC substrate, and the ordinate represents a temperature at the uppermost growth surface. It clearly shows that as the resistivity of a substrate is lowed, the surface temperature is lowed. If the amount of the lowered temperature is within 10° C., countermeasure could be taken by finely adjusting the growth temperature. However, if the temperature lowering is more than 10° C., crystal uniformity and good device characteristics could not be obtained even when the temperature is forced to be raised. This may be ascribed to that the conditions of crystal growth in a growth system change greatly. Namely, a presently usable range is a range indicated by hatching in the graph, i.e., a resistivity range of 0.08 Ωcm or higher.

An epitaxial layer was grown on each green SiC substrate having a different resistivity, and a trap concentration was measured. A HEMT structure was formed and a sheet resistivity was measured.

Figure 5A:
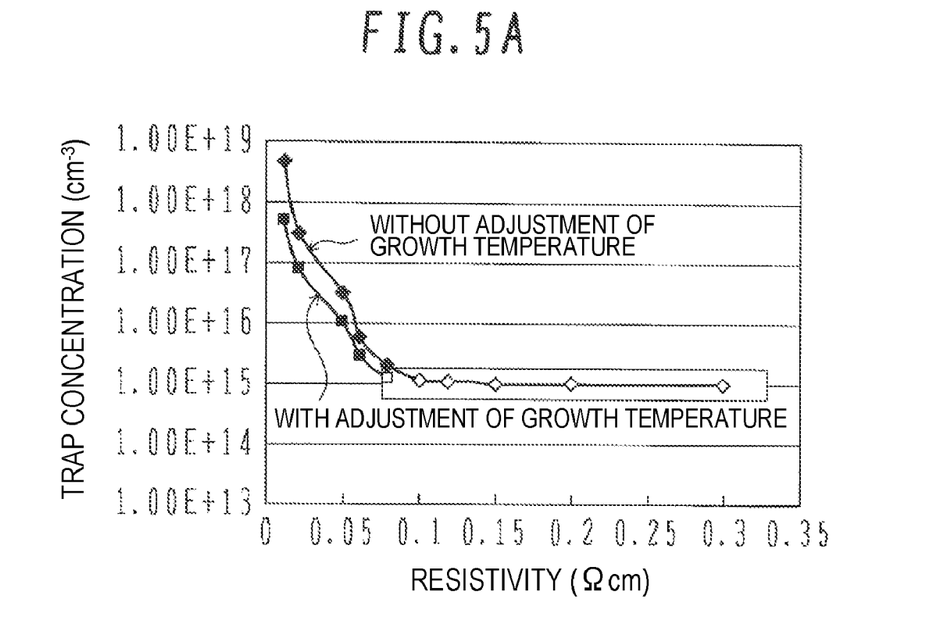
FIGS. 5A and 5B are graphs showing a trap concentration and a sheet resistivity of a grown layer dependent upon a resistivity of a conductive SiC substrate.
Figure 5B:
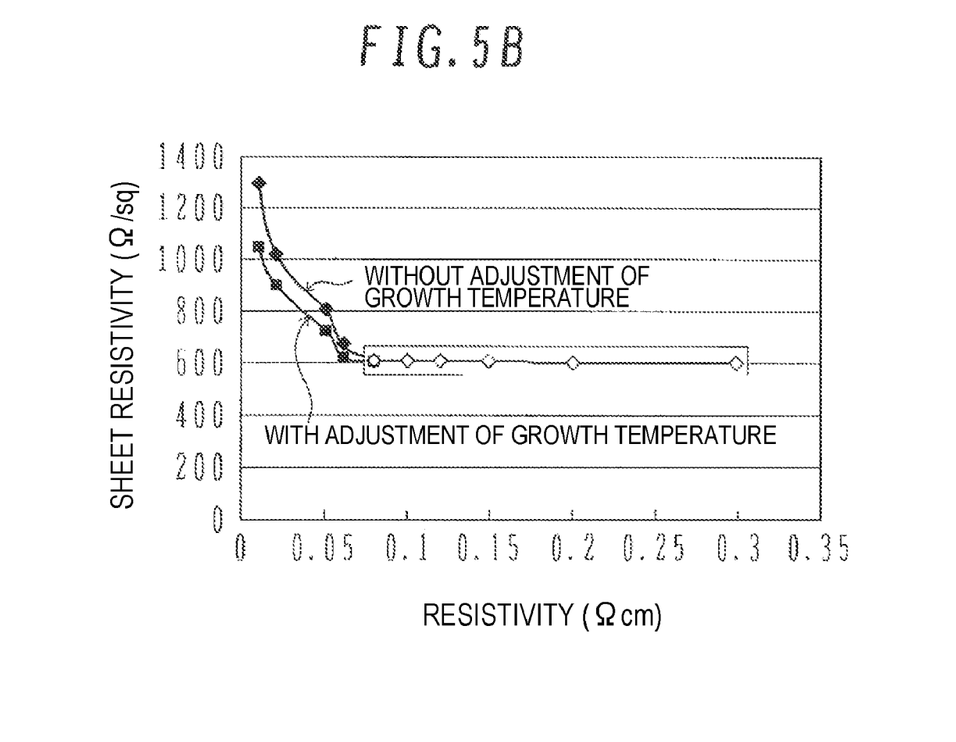

FIGS. 5A and 5B are graphs showing relation between a trap concentration and sheet resistivity of respective SiC substrates having different resistivities. FIG. 5A indicates that as a resistivity of an SiC substrate lowers, a trap concentration increases. It is considered that a trap concentration increases if carbon is captured in crystal or point defects increase. It also indicates that trap formation cannot be suppressed even if temperature setting is adjusted.

FIG. 5B indicates that as resistivity of the SiC substrate lowers, sheet resistivity increases. It is considered that as traps increase, two-dimensional electron gas reduces and a sheet resistivity increases.

These results also indicate that good device characteristics can be obtained if a resistivity of a green SiC substrate is not lower than 0.08 Ωcm.

Figure 6A:
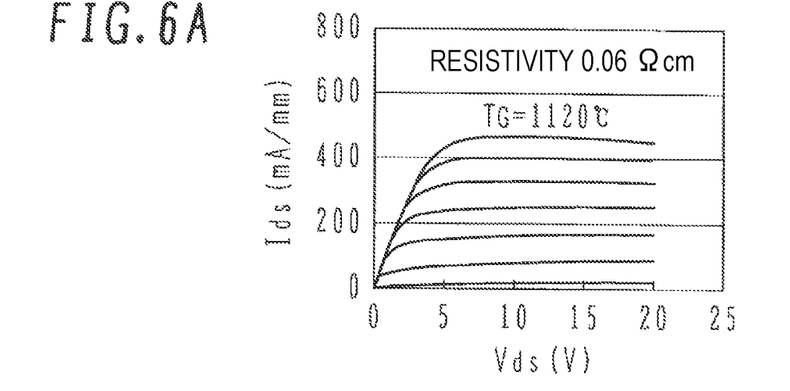
FIGS. 6A, 6B and 6C are graphs showing I-V characteristics of GaN-HEMTs formed on conductive SiC substrates and on a semi-insulating SiC substrate.
Figure 6B:
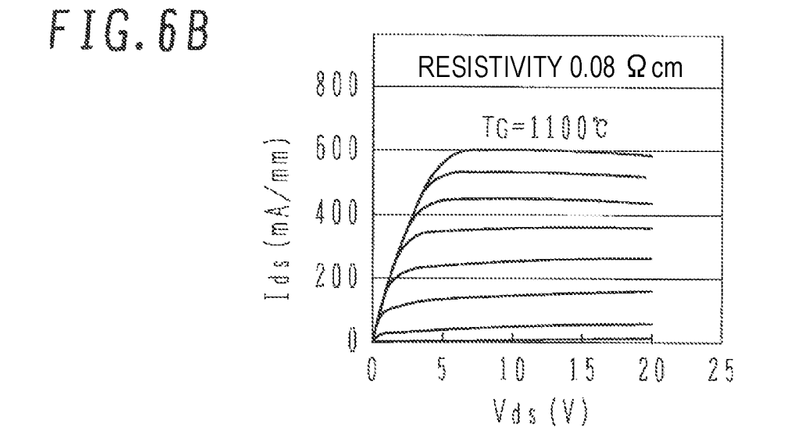
Figure 6C:
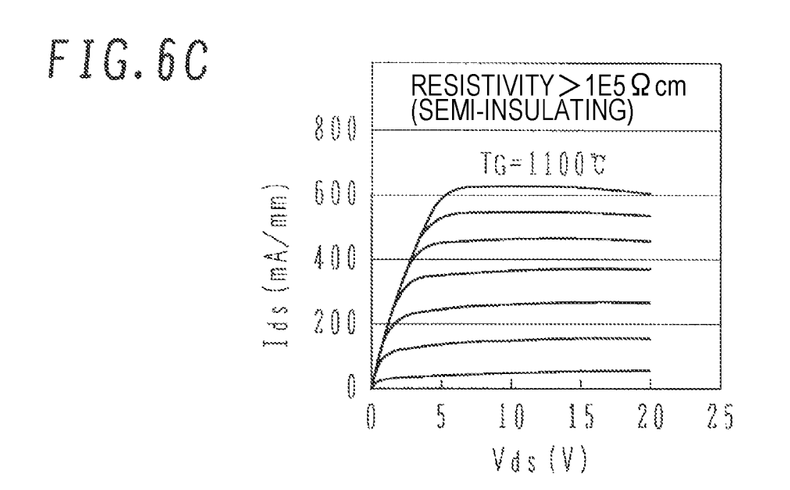

FIGS. 6A, 6B and 6C show I-V characteristics of GaN-HEMTs formed on green SiC substrates having resistivities of 0.06 Ωcm, 0.08 Ωcm and semi-insulating (resistivity larger than 1E5 Ωcm). For a substrate having resistivity of 0.08 Ωcm, growth setting temperature was 1100° C. For a substrate having a resistivity of 0.06 Ωcm, growth setting temperature was further raised from 1100° C. to 1120° C. to adjust a surface temperatures. The SiC substrate having the resistivity of 0.08 Ωcm showed I-V characteristics approximately similar to those of the semi-insulating substrate. It is clear that a drain current reduces for the substrate having resistivity of 0.06 Ωcm.

Figure 7:
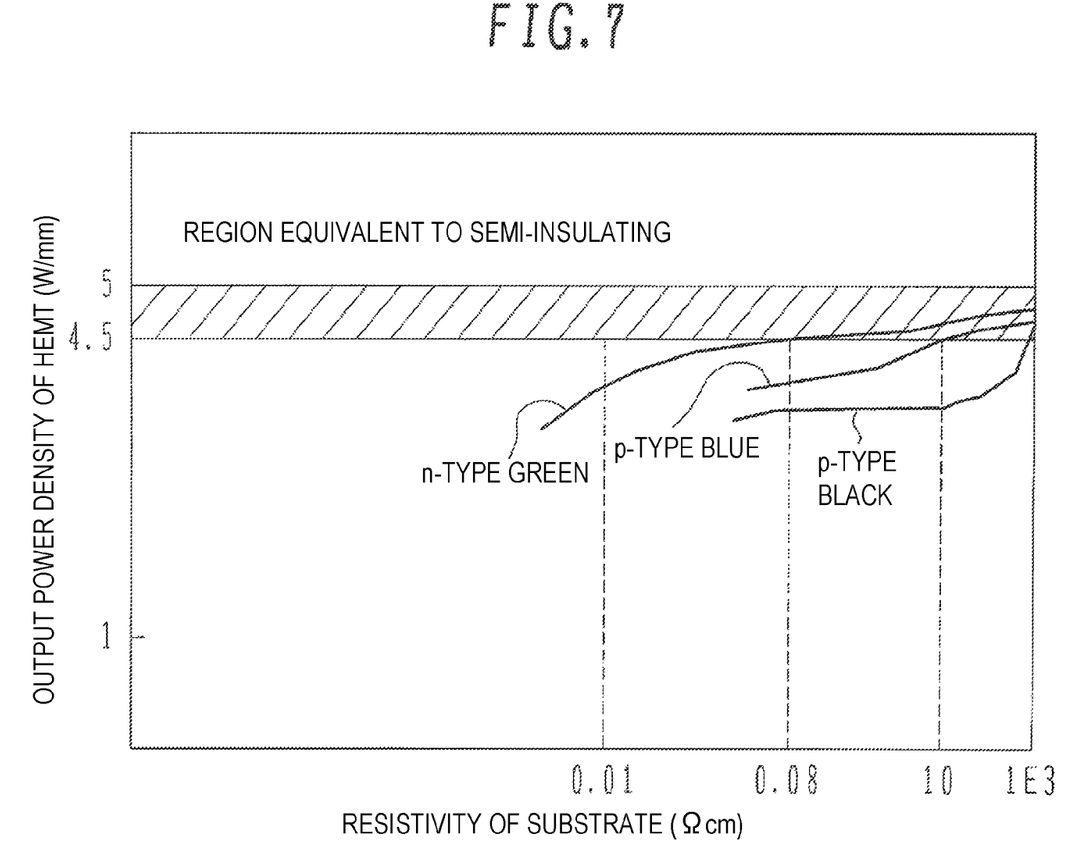
FIG. 7 is a graph showing regions of resistivity as the selection criterion for conductive SiC substrates derived from power density of HEMTs.

FIG. 7 shows results of on-wafer power measurement on each device having a gate width of 1 mm. Power density equivalent to a range of the semi-insulating SiC substrate could be obtained for green substrates having resistivity of 0.08 Ωcm or higher, for blue substrates having resistivity of 10 Ωcm or higher, and for black substrates having resistivity of 1E3 Ωcm or higher.

Resistivity of 1E5 Ωcm or higher is in a semi-insulating region, and no cost merit is enjoyed. It can therefore be said that an upper resistivity limit of a conductive SiC substrate in each color is 1E5 Ωcm.

Figure 1B:
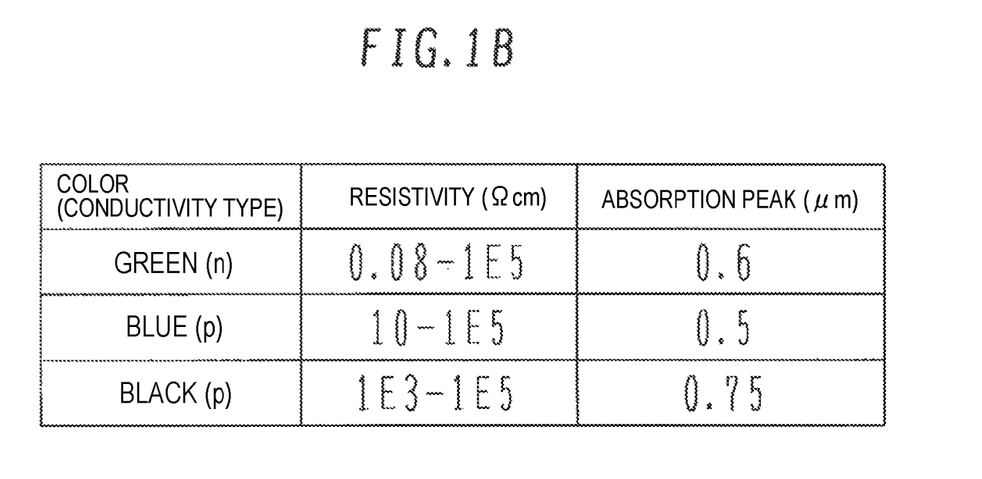
FIG. 1B is a table showing the characteristics of a conductive SiC substrate.

FIG. 1B is a table collectively showing color, resistivity range, and peak wavelength of optical absorption band, of usable conductive substrate. There is a difference between optical absorption peak wavelengths corresponding to respective colors. Resistivity ranges establishing selection criterion are also different for the respective colors. For green conductive SiC substrate, conductive substrates having resistivity of 0.08 Ωcm to 1E5 Ωcm may be selected. For blue conductive SiC substrates, conductive substrates having resistivity of 10 Ωcm to 1E5 Ωcm may be selected. For black conductive SiC substrates, conductive substrates having resistivity of 1E3 Ωcm to 1E5 Ωcm may be selected.

A curve c1 shown in FIG. 3 indicates a power concentration at each run when conductive SiC substrates are selected in accordance with the above-described selection criteria and thereafter a GaN-HEMT structure shown in FIG. 1A is formed on each substrate. It can be seen that variation reduces considerably and uniform characteristics are obtained. In this manner, it is possible to manufacture GaN-HEMT at low cost which is capable of high voltage and high speed operation, when a conductive SiC substrate is selected in accordance with the selection criteria shown in FIG. 1B, the selected substrate is used as the conductive SiC substrate 101 shown in FIG. 1A, and a GaN-HEMT structure is formed thereon.

Although manufacture of GaN-HEMT has been described by way of example, GaN series compound semiconductor of $Al_xIn_yGa_{1-x-y}N$ ($0 \leq x \leq 1.0$, $0 \leq y \leq 1.0$) including AlN, GaN and AlGaN will be possible to be grown on a conductive single crystal SiC substrate. Products of GaN series compound semiconductor wafers may also be provided such as a wafer with a grown AlN buffer layer, and a wafer with a lamination of a GaN layer/a non-doped AlGaN layer/n-type AlGaN layer/n-type GaN layer or part of these layers grown on an AlN buffer layer. These semiconductor device and semiconductor wafer are collectively called herein a semiconductor structure.

Although manufacture of GaN-HEMT has been described by way of example, electronic devices to be manufactured are not limited to HEMT, but other electronic devices and optical devices may also be manufactured.

It will be apparent for those skilled in the art that various modifications, improvements, substitutions, combinations and the like are possible.

It is possible to provide GaN series compound semiconductor devices and wafers therefor.

What we claim are:

1. A method for manufacturing a compound semiconductor structure, comprising:
   (a) detecting color and resistivity of a conductive SiC substrate;
   (b) determining whether detected color and resistivity in said step (a) are in one of a number of predetermined categories; and
   (c) when detected color and resistivity in said step (a) are determined to be in one of a number of the predetermined categories in said step (b), epitaxially growing a GaN series compound semiconductor layer on said conductive SiC substrate.

2. The method for manufacturing a compound semiconductor structure according to claim 1, wherein three of said predetermined categories in said step (b) have the following characteristics:
   category (i): main color is green, conductivity type is n-type and resistivity is 0.08 $\Omega$cm to $1 \times 10^5$ $\Omega$cm,
   category (ii): main color is black, conductivity type is p-type and resistivity is $1 \times 10^3$ $\Omega$cm to $1 \times 10^5$ $\Omega$cm, and
   category (iii): main color is blue, conductivity type is p-type and resistivity is 10 $\Omega$cm to $1 \times 10^5$ $\Omega$cm.

3. The method for manufacturing a compound semiconductor structure according to claim 1, wherein said step (c) includes:
   (c-1) growing an AlInGaN layer having a thickness not thinner than 10 μm on said conductive SiC substrate by hydride VPE.

4. The method for manufacturing a compound semiconductor structure according to claim 3, wherein said step (c) includes:
   (c-2) after said step (c-1), laminating an i-type GaN layer, an i-type AlGaN layer and an n-type AlGaN layer on and above said AlInGaN layaer by MOCVD.

5. The method for manufacturing a compound semiconductor structure according to claim 4, wherein a substrate heating temperature at said step (c-2) is adjusted depending upon said color and resistivity.

6. The method for manufacturing a compound semiconductor structure according to claim 4, wherein said step (c-2) further laminates an n-type GaN layer by MOCVD.

7. A method for manufacturing a compound semiconductor structure, comprising:
   (a) detecting color and resistivity of a conductive SiC substrate;
   (b) determining whether results of said detecting step (a) are in predetermined categories;
   (c) when the results of said detecting step (a) are determined to be in the predetermined categories in said step (b), epitaxially growing a GaN series compound semiconductor layer on said conductive SiC substrate; and
   (d) forming a source electrode, a gate electrode, and a drain electrode above said GaN series compound semiconductor layer.

8. The method for manufacturing a compound semiconductor structure according to claim 7, wherein three of said predetermined categories in said step (b) have the following characteristics:
   category (i): main color is green, conductivity type is n-type and resistivity is 0.08 $\Omega$cm to $1 \times 10^5$ $\Omega$cm,
   category (ii): main color is black, conductivity type is p-type and resistivity is $1 \times 10^3$ $\Omega$cm to $1 \times 10^5$ $\Omega$cm, and
   category (iii): main color is blue, conductivity type is p-type and resistivity is 10 $\Omega$cm to $1 \times 10^5$ $\Omega$cm.

9. The method for manufacturing a compound semiconductor structure according to claim 7, wherein said step (c) includes:
   (c-1) growing an AlInGaN layer having a thickness not thinner than 10 μm on said conductive SiC substrate by hydride VPE.

10. The method for manufacturing a compound semiconductor structure according to claim 9, wherein said step (c) includes:
    (c-2) after said step (c-1), laminating an i-type GaN layer, an i-type AlGaN layer and an n-type AlGaN layer on and above said AlInGaN layaer by MOCVD.

11. The method for manufacturing a compound semiconductor structure according to claim 10, wherein a substrate heating temperature at said step (c-2) is adjusted depending upon said color and resistivity.

12. The method for manufacturing a compound semiconductor structure according to claim 10, wherein said step (c-2) further laminates an n-type GaN layer by MOCVD.

13. The method for manufacturing a compound semiconductor structure according to claim 12, wherein said step (d) includes:
    forming a silicon nitride film on the n-type GaN layer;
    forming openings through the silicon nitride film at source and drain contact regions;
    etching the n-type GaN layer;
    forming a source electrode and a drain electrode at the source and drain contact regions; and
    annealing the source electrode and the drain electrode to form ohmic contacts.

14. The method for manufacturing a compound semiconductor structure according to claim 13, wherein said step (d) further includes:
    etching the silicon nitride film at gate contact region; and
    forming a gate electrode of Schottky contact at the gate contact region.

15. A method for manufacturing a compound semiconductor structure, comprising:
    (a) obtaining information of a conductive SiC substrate on color and resistivity which are governed by impurities;

(b) determining whether the color and resistivity of a conductive SiC substrate are in one of the following predetermined categories:
  category (i): main color is green, conductivity type is n-type and resistivity is 0.08 $\Omega$cm to $1\times10^5$ $\Omega$cm,
  category (ii): main color is black, conductivity type is p-type and resistivity is $1\times10^3$ $\Omega$cm to $1\times10^5$ $\Omega$cm, and
  category (iii): main color is blue, conductivity type is p-type and resistivity is 10 $\Omega$cm to $1\times10^5$ $\Omega$cm; and
(c) epitaxially growing a GaN series compound semiconductor layer on a conductive SiC substrate having color and resistivity belonging to one of said predetermined categories.

16. The method for manufacturing a compound semiconductor structure according to claim 15, wherein said step (c) includes:
  (c-1) growing an AlInGaN layer having a thickness not thinner than 10 μm on said conductive SiC substrate by hydride VPE; and
  (c-2) after said step (c-1), laminating an i-type GaN layer, an i-type AlGaN layer, an n-type AlGaN layer and an n-type GaN layer above said AlInGaN layaer by MOCVD.

17. The method for manufacturing a compound semiconductor structure according to claim 16, further comprising the step of:
  (d) forming a silicon nitride film on the n-type GaN layer.

18. The method for manufacturing a compound semiconductor structure according to claim 17, further comprising the steps of:
  (e) forming openings through the silicon nitride film at source and drain contact regions;
  (f) etching the n-type GaN layer;
  (g) forming a source electrode and a drain electrode at the source and drain contact regions;
  (h) annealing the source electrode and the drain electrode to form ohmic contacts;
  (i) etching the silicon nitride film at gate contact region; and
  (j) forming a gate electrode of Schottky contact at the gate contact region.

\* \* \* \* \*